(12) United States Patent
Nitanai et al.

(10) Patent No.: US 12,539,539 B2
(45) Date of Patent: Feb. 3, 2026

(54) SILVER PARTICLES, METHOD FOR PRODUCING SILVER PARTICLES, PASTE COMPOSITION, SEMICONDUCTOR DEVICE, AND ELECTRICAL AND/OR ELECTRONIC COMPONENTS

(71) Applicant: KYOCERA Corporation, Kyoto (JP)

(72) Inventors: Yuya Nitanai, Yokohama (JP); Masakazu Fujiwara, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 14 days.

(21) Appl. No.: 17/636,082

(22) PCT Filed: Aug. 7, 2020

(86) PCT No.: PCT/JP2020/030377
§ 371 (c)(1),
(2) Date: Feb. 17, 2022

(87) PCT Pub. No.: WO2021/039361
PCT Pub. Date: Mar. 4, 2021

(65) Prior Publication Data
US 2022/0288681 A1    Sep. 15, 2022

(30) Foreign Application Priority Data
Aug. 26, 2019    (JP) .................. 2019-153954

(51) Int. Cl.
| B22F 1/05 | (2022.01) |
| B22F 1/00 | (2022.01) |
| B22F 1/06 | (2022.01) |
| B22F 1/103 | (2022.01) |
| B22F 1/17 | (2022.01) |
| B22F 9/24 | (2006.01) |
| B23K 35/30 | (2006.01) |
| C22C 1/04 | (2023.01) |
| H01L 23/00 | (2006.01) |

(52) U.S. Cl.
CPC .............. *C22C 1/0466* (2013.01); *B22F 1/00* (2013.01); *B22F 1/05* (2022.01); *B22F 1/06* (2022.01); *B22F 1/103* (2022.01); *B22F 1/17* (2022.01); *B22F 9/24* (2013.01); *H01L 24/29* (2013.01); *B22F 2301/255* (2013.01); *B22F 2304/054* (2013.01); *B23K 35/3006* (2013.01); *H01L 24/32* (2013.01); *H01L 2224/2929* (2013.01); *H01L 2224/29339* (2013.01); *H01L 2224/29439* (2013.01); *H01L 2224/32225* (2013.01); *H01L 2224/32245* (2013.01); *H01L 2924/0635* (2013.01); *H01L 2924/0665* (2013.01); *Y10T 428/12181* (2015.01)

(58) Field of Classification Search
None
See application file for complete search history.

(56) References Cited

U.S. PATENT DOCUMENTS

| 2005/0183543 A1 | 8/2005 | Sasaki et al. |
| 2005/0279970 A1 | 12/2005 | Ogi et al. |
| 2006/0073667 A1 | 4/2006 | Li et al. |
| 2015/0262729 A1* | 9/2015 | Aoki ................. B05D 7/14 427/125 |
| 2018/0269074 A1 | 9/2018 | Kamikoriyama et al. |
| 2019/0206805 A1* | 7/2019 | Hong ................. C09D 201/00 |

FOREIGN PATENT DOCUMENTS

| JP | 2003309352 A | * 10/2003 | ............ B22F 1/0059 |
| JP | 2004107728 A | * 4/2004 | ............ B22F 1/0022 |
| JP | 2005-146408 A | 6/2005 | |
| JP | 2006-002228 A | 1/2006 | |
| JP | 2007-080635 A | 3/2007 | |
| JP | 2013-142173 A | 7/2013 | |
| JP | 2016-096031 A | 5/2016 | |
| WO | 2015/162881 A1 | 10/2015 | |

\* cited by examiner

*Primary Examiner* — Xiaobei Wang
(74) *Attorney, Agent, or Firm* — Volpe Koenig

(57) ABSTRACT

Provided are silver particles including a silver powder and a silver layer that includes primary particles, the primary particles being smaller than the silver powder.

9 Claims, No Drawings

SILVER PARTICLES, METHOD FOR PRODUCING SILVER PARTICLES, PASTE COMPOSITION, SEMICONDUCTOR DEVICE, AND ELECTRICAL AND/OR ELECTRONIC COMPONENTS

TECHNICAL FIELD

The present disclosure relates to silver particles, a method of producing silver particles, a paste composition, a semiconductor device, and electrical and/or electronic components.

BACKGROUND ART

In recent years, the efficiency of semiconductor elements has advanced, and this has increased the amount of heat generated by semiconductor elements, as well as their driving temperature. In addition, bonding material need to have reliability and heat dissipation at high temperatures. Examples of candidate bonding materials include solders and silver pastes, both of which have been conventionally used in the related field, but these bonding materials exhibit insufficient reliability and heat dissipation and are therefore incompatible for such high temperature applications. Thus, there is a desire for the provision of a bonding method that is suited for high temperature operations. For example, Patent Document 1 proposes a silver sintering paste using silver nanoparticles that exhibit excellent electrical conductivity due to low temperature firing.

CITATION LIST

Patent Literature

Patent Document 1: JP 2013-142173 A

SUMMARY OF INVENTION

The present disclosure relates to the following:
[1] A silver particle including a silver powder and a silver layer that includes primary particles, the primary particles being smaller than the silver powder.
[2] A method of producing a silver particle, the method including forming a silver layer over a surface of a silver powder (A) by a liquid phase reduction method.
[3] A paste composition containing the silver particle described in [1] or [2] above.
[4] A semiconductor device formed by bonding using the paste composition described in [3] above.
[5] Electrical and/or electronic components formed by bonding using the paste composition described in [3] above.

DESCRIPTION OF EMBODIMENTS

Hereinafter, the present disclosure will be described in detail with reference to an embodiment.

Note that in the present disclosure, the term "(meth)acrylate" refers to an acrylate and/or methacrylate.

Silver Particles

The silver particles of the present embodiment contain a silver powder and a silver layer that includes primary particles, the primary particles being smaller than the silver powder.

The silver powder constituting the base of the silver particles is not particularly limited, and for example, a silver powder prepared by a known method such as atomization, electrolysis, chemical reduction, grinding and pounding, a plasma rotating electrode method, a uniform droplet spray method, or a heat treatment method can be used. From the perspectives of the particle size and particle shape control, the silver powder is preferably prepared by atomization, electrolysis, or chemical reduction.

Furthermore, a commercially available product may be used, and specific examples thereof include Ag-HWQ (available from Fukuda Metal Foil & Powder Co., Ltd., D50=1.8 µm, spherical) and SLOT (available from Mitsui Mining & Smelting Co., Ltd., D50=1.23 µm, indefinite shape). These may be used alone or in combination of two or more.

An average particle size of the silver powder may be: from 0.5 µm to 30 µm, greater than 0.5 µm and less than or equal to 20 µm, or from 1 µm to 20 µm. Furthermore, the shape is not particularly limited, and examples thereof include spherical, plate-shaped, flake-shaped, scale-shaped, dendritic, rod-shaped, wire-shaped, and indefinite shaped.

The average particle size of the silver powder is a particle size (50% particle size D50) at which the cumulative volume is 50% in a particle size distribution measured using a laser diffraction-type particle size distribution measurement device.

The silver layer is formed, for example, by reducing a silver compound using a reducing compound and aggregating primary particles of silver released from the silver compound.

The silver compound may be at least one selected from silver nitrate, silver chloride, silver acetate, silver oxalate, and silver oxide, and is preferably silver nitrate or silver acetate from the perspective of solubility in water.

The reducing compound is not particularly limited as long as the reducing compound has the reducing power to reduce the silver compound and cause the silver to precipitate.

Examples of the reducing compound include hydrazine derivatives. Examples of the hydrazine derivative include hydrazine monohydrate, methylhydrazine, ethylhydrazine, n-propylhydrazine, i-propylhydrazine, n-butylhydrazine, i-butylhydrazine, sec-butylhydrazine, t-butylhydrazine, n-pentylhydrazine, i-pentylhydrazine, neo-pentylhydrazine, t-pentylhydrazine, n-hexylhydrazine, i-hexylhydrazine, n-heptylhydrazine, n-octylhydrazine, n-nonylhydrazine, n-decylhydrazine, n-undecylhydrazine, n-dodecylhydrazine, cyclohexylhydrazine, phenylhydrazine, 4-methylphenylhydrazine, benzylhydrazine, 2-phenylethylhydrazine, 2-hydrazinoethanol, and acetohydrazine. These may be used alone or in combination of two or more.

The average particle size of the primary particles may be from 10 to 100 nm, from 10 to 50 nm, or from 20 to 50 nm. If the average particle size of the primary particles is 10 nm or greater, the specific surface area is not overly increased, and workability of the paste can be improved, and when the average particle diameter is 100 nm or less, favorable sinterability can be achieved.

The average particle size of the primary particles can be determined by obtaining the particle size of 200 silver particles measured by observing with a field emission scanning electron microscope (FE-SEM) a cross section of spherical silver particles cut by a focused ion beam (FIB) apparatus, and then obtaining an average of the quantity thereof. Specifically, the viscosity can be measured by the method described in the examples.

The average particle size of the silver particles may be from 0.5 to 5.0 µm, from 0.5 to 3.0 µm, or from 1.0 to 3.0 µm. When the average particle size of the silver particles is 0.5 μm or larger, storage stability is favorable, and when the average particle size is 5.0 μm or less, sinterability becomes favorable.

The average particle size of the silver particles is a particle size (50% particle size D50) at which the cumulative volume reaches 50% in a particle size distribution measured using a laser diffraction particle size distribution measurement device, and specifically, the average particle size can be measured by the method described in the examples.

The tap density of the silver particles may be from 4.0 to 7.0 $g/cm^3$, from 4.5 to 7.0 $g/cm^3$, or from 4.5 to 6.5 $g/cm^3$. When the tap density of the silver particles is 4.0 $g/cm^3$ or higher, a paste can be filled with the silver particles at a high level, and if the tap density is less than or equal to 7.0 $g/cm^3$, sedimentation of the silver particles in the paste can be reduced.

The tap density of the silver particles can be measured using a tap density measuring device, and specifically can be measured by the method described in the examples.

The specific surface area of the silver particles determined by the BET method may be from 0.5 to 1.5 $m^2/g$, from 0.5 to 1.2 $m^2/g$, or from 0.6 to 1.2 $m^2/g$. When the specific surface area of the silver particles is 0.5 $m^2/g$ or higher, contact among silver particles can be increased, and when the specific surface area is less than or equal to 1.5 $m^2/g$, the viscosity of the paste can be reduced.

The specific surface area of the silver particles can be measured by the single point BET method through nitrogen adsorption using a specific surface area measuring device, and specifically can be measured by the method described in the examples.

Method of Producing Silver Particles

The method of producing silver particles according to the present embodiment includes a step of forming a silver layer over the surface of the silver powder (A) by a liquid phase reduction method (hereinafter, also simply referred to as a silver layer forming step).

In the silver layer forming step, the silver powder (A), a silver compound (B), and a reducing compound (C) are mixed in a liquid phase.

As the silver powder (A), the silver compound (B), and the reducing compound (C), those described in the Silver particles section above can be used.

The silver compound (B) may be a silver ammine complex solution from the perspective of stability of the complex.

The silver ammine complex solution is not particularly limited. In general, the silver ammine complex solution is obtained by dissolving a silver compound in ammonia water (see, for example, JP 2014-181399 A), but may also be prepared by adding an amine compound to the silver compound, and then dissolving the mixture in an alcohol.

The added amount of ammonia may be from 2 to 50 mol, from 5 to 50 mol, or from 10 to 50 mol, per mole of silver in the aqueous solution containing the silver compound (B). When the added amount of ammonia is within the range described above, the average particle size of the primary particles of silver released from the silver compound can be within the range described above.

The silver ammine complex in the silver ammine complex solution is reduced by the reducing compound (C), and a silver particle-containing slurry is obtained.

Through reduction of the silver ammine complex using the reducing compound (C), silver is released from the silver ammine complex, primary particles of the silver thereof are aggregated around the silver powder (A) to form secondary particles, and thereby silver particles of the present embodiment are formed.

Aggregation of the primary particles can be controlled by appropriately adjusting the amount of silver in the silver ammine complex, the content of the reducing compound (C), and the average particle size of the powder (A) that is added, and thereby the average particle size of the obtained secondary particles (silver particles) can be set to within the range described above.

The content of the reducing compound (C) may be from 0.25 to 20.0 mol, from 0.25 to 10.0 mol, or from 1.0 to 5.0 mol, per mole of silver in the silver ammine complex, Furthermore, the temperature of the silver ammine complex solution when reducing the silver amine complex may be lower than 30° C., or may be from 0 to 20° C. If the temperature of the silver ammine complex solution is within this range, aggregation of the primary particles can be controlled, and the average particle size of the obtained secondary particles can be set to within the range described above.

A protecting group can be introduced into the silver particles in the silver particle-containing slurry by further adding an organic protecting compound (D) to the silver particle-containing slurry obtained as described above.

Examples of the organic protecting compound (D) include carboxylic acids, alkylamines, carboxylic acid amine salts, and amides. From the perspective of stability of the particles, the organic protecting compound (D) may be at least one type selected from carboxylic acids, alkylamines, and carboxylic acid amine salts, and from the perspective of enhancing dispersibility, the organic protecting compound (D) is preferably a carboxylic acid.

Examples of the carboxylic acid include monocarboxylic acids, such as formic acid, acetic acid, propionic acid, butyric acid, valeric acid, caproic acid, caprylic acid, octylic acid, nonanoic acid, capric acid, oleic acid, stearic acid, and isostearic acid; dicarboxylic acids, such as oxalic acid, malonic acid, succinic acid, glutaric acid, adipic acid, pimelic acid, suberic acid, azelaic acid, sebacic acid, and diglycolic acid; aromatic carboxylic acids, such as benzoic acid, phthalic acid, isophthalic acid, terephthalic acid, salicylic acid, and gallic acid; and hydroxy acids, such as glycolic acid, lactic acid, tartronic acid, malic acid, glyceric acid, hydroxybutyric acid, tartaric acid, citric acid, and isocitric acid. These may be used alone or in combination of two or more.

The compounded amount of the organic protecting compound (D) may be from 1 to 20 mmol, from 1 to 10 mmol, or from 1 to 5 mmol per mole of silver particles. When the compounded amount of the organic protecting compound is 1 mmol or greater, the silver particles can be dispersed in the resin, and if the compounded amount is less than or equal to 20 mmol, the silver particles can be dispersed in the resin without impairing sinterability.

Formation of a Mixture

A silver powder (A), a silver compound (B), and a reducing compound (C), and as necessary, an organic protecting compound (D) are mixed in a reaction container. The order of mixing these compounds is not particularly limited, and the compounds described above may be mixed in any order.

The silver particles obtained by the method of producing silver particles of the present embodiment are secondary particles in which primary particles of silver of a nano size are aggregated on the surface of a silver powder, and thereby the silver particles maintain the high activity level of the surface of the primary particles of silver and exhibit sinterability (self-sinterability) between secondary particles at low temperatures. Sintering of the silver particles progresses in parallel with sintering of the silver particles and the bonding member. Therefore, a paste composition that excels in thermal conductivity and adhesive properties can be obtained by using the silver particles described above.

Paste Composition

The paste composition of the present embodiment contains the silver particles described above. The paste composition of the present embodiment has excellent dispersibility at low viscosity and excels in adhesive properties and thermal conductivity, and can be used to obtain a cured product with excellent low-stress properties and minimal volume shrinkage. Therefore, the paste composition of the present embodiment can be used as a die attach material for element adhesion or as a material for adhering a heat-dissipating member, or the like.

The paste composition of the present embodiment can be used as an adhesive material, which is a paste, having appropriate viscosity by containing a thermosetting resin.

The thermosetting resin is not particularly limited, and any thermosetting resin can be used as long as the thermosetting resin is one that is generally used in adhesive applications. The thermosetting resin may be a liquid resin or a resin that is liquid at room temperature (25° C.). The thermosetting resin may be at least one type selected from cyanate resins, epoxy resins, acrylic resins, and maleimide resins. These may be used alone or in a combination of two or more.

The cyanate resin is a compound having a —NCO group in the molecule, and is a resin that is cured by forming a three-dimensional mesh structure upon reaction of the —NCO groups by heating. Specific examples of the cyanate resin include 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, bis(3,5-dimethyl-4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, and cyanates obtained by a reaction between a novolac resin and a cyanogen halide. In addition, a prepolymer having a triazine ring formed by trimerizing cyanate groups of these polyfunctional cyanate resins can also be used. The prepolymer is obtained by polymerizing the polyfunctional cyanate resin monomer described above, using as a catalyst, for example, an acid such as a mineral acid or a Lewis acid, a base such as a sodium alcoholate or a tertiary amine, or a salt such as sodium carbonate.

A commonly known curing accelerator can be used as the curing accelerator for the cyanate resin. Examples thereof include, but are not limited to, organometallic complexes, such as zinc octylate, tin octylate, cobalt naphthenate, zinc naphthenate, and iron(III) acetylacetone; metal salts, such as aluminum chloride, tin chloride, and zinc chloride; and amines, such as triethylamine, and dimethylbenzylamine. A single type of these curing accelerators can be used, or two or more types can be mixed and used.

The epoxy resin is a compound having one or more glycidyl groups per molecule, and is a resin that is cured by forming a three-dimensional mesh structure upon reaction of the glycidyl groups by heating. The epoxy resin may be a compound containing two or more glycidyl groups per molecule. This is because sufficient cured product properties cannot be exhibited with only a compound having one glycidyl group per molecule, even when the compound is reacted. A compound having two or more glycidyl groups per molecule can be obtained by epoxidizing a compound having two or more hydroxyl groups. Examples of such compounds include, but are not limited to, bifunctional compounds obtained by epoxidizing, for example, bisphenol compounds or derivatives thereof, such as bisphenol A, bisphenol F, and biphenol, diols having an alicyclic structure or derivatives thereof, such as hydrogenated bisphenol A, hydrogenated bisphenol F, hydrogenated bisphenol, cyclohexanediol, cyclohexanedimethanol, and cyclohexanediethanol, and aliphatic diols and derivatives thereof, such as butanediol, hexanediol, octanediol, nonanediol, and decanediol; trifunctional compounds obtained by epoxidizing compounds having a trihydroxyphenyl methyl skeleton or an aminophenol skeleton; and polyfunctional compounds obtained by epoxidizing a phenolic novolac resin, a cresol novolac resin, a phenol aralkyl resin, a biphenyl aralkyl resin, or a naphthol aralkyl resin.

Furthermore, the epoxy resin is formed into a paste form as a paste composition at room temperature (25° C.), and therefore the epoxy resin may be a liquid at room temperature (25° C.) by itself or as a mixture. A reactive diluent can also be used, as is customary. Examples of the reactive diluent include monofunctional aromatic glycidyl ethers, such as phenyl glycidyl ether and cresyl glycidyl ether, and aliphatic glycidyl ethers.

Examples of a curing agent for the epoxy resin include aliphatic amines, aromatic amines, dicyandiamides, dihydrazide compounds, acid anhydrides, and phenol resins. Examples of the dihydrazide compounds include carboxylic acid dihydrazides, such as adipic acid dihydrazide, dodecanoic acid dihydrazide, isophthalic acid dihydrazide, and p-oxybenzoic acid dihydrazide. Examples of the acid anhydrides include phthalic anhydride, tetrahydrophthalic anhydride, hexahydrophthalic anhydride, endomethylene tetrahydrophthalic anhydride, dodecenylsuccinic anhydride, a reaction product between maleic anhydride and polybutadiene, and a copolymer of maleic anhydride and styrene.

Furthermore, a curing accelerator can be compounded to facilitate curing. Examples of the curing accelerator for the epoxy resin include imidazoles, triphenylphosphine or tetraphenylphosphine and salts thereof, and amine-based compounds and salts thereof, such as diazabicycloundecene. The curing accelerator may be an imidazole compound having a melting point of 180° C. or higher, such as 2-methylimidazole, 2-ethylimidazole, 2-phenylimidazole, 2-phenyl-4-methylimidazole, 2-phenyl-4-methyl-5-hydroxymethyl imidazole, 2-phenyl-4,5-dihydroxymethyl imidazole, 2-$C_{11}H_{23}$-imidazole, or an adduct of 2-methylimidazole and 2,4-diamino-6-vinyltriazine.

Examples of the acrylic resin include (meth)acrylates having a hydroxyl group, such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, 1,2-cyclohexanediol mono(meth)acrylate, 1,3-cyclohexanediol mono(meth)acrylate, 1,4-cyclohexanediol mono(meth)acrylate, 1,2-cyclohexane dimethanol mono(meth)acrylate, 1,3-cyclohexane dimethanol mono(meth)acrylate, 1,4-cyclohexane dimethanol mono(meth)acrylate, 1,2-cyclohexane diethanol mono(meth)acrylate, 1,3-cyclohexane diethanol mono(meth)acrylate, 1,4-cyclohexane diethanol mono(meth)acrylate, glycerol mono(meth)acrylate, glycerol di(meth)acrylate, trimethylolpropane mono(meth)acrylate, trimethylolpropane di(meth)acrylate, pentaerythritol mono(meth)acrylate, pentaerythritol di(meth)acrylate, pentaerythritol tri(meth)acrylate, and neopentylglycol mono(meth)acrylate; and (meth)acrylates having a carboxyl group, obtained by reacting these (meth)acrylates having a hydroxyl group with a carboxylic acid or derivative thereof. Examples of dicarboxylic acids that can be used herein include oxalic acid, malonic acid, succinic acid, glutaric acid, adipic acid, pimelic acid, suberic acid, azelaic acid, sebacic acid, maleic acid, fumaric acid, phthalic acid, tetrahydrophthalic acid, hexahydrophthalic acid, and derivatives thereof.

Furthermore, examples of the acrylic resin include compounds having a (meth)acrylic group, including polyethers, polyesters, polycarbonates, and poly(meth)acrylates having a molecular weight from 100 to 10000; (meth)acrylates having a hydroxy group; and (meth)acrylamides having a hydroxy group.

The maleimide resin is a compound containing one or more maleimide groups per molecule, and is a resin that is cured by forming a three-dimensional mesh structure upon reaction of the maleimide groups by heating. Examples of the maleimide resin include bismaleimide resins such as N,N'-(4,4'-diphenylmethane)bismaleimide, bis(3-ethyl-5-methyl-4-maleimidophenyl) methane, and 2,2-bis[4-(4-maleimidophenoxy)phenyl] propane. The maleimide resin may be a compound obtained by reacting a dimer acid diamine with maleic anhydride; or a compound obtained by reacting a maleimidated amino acid such as maleimidoacetic acid or maleimidocaproic acid, with a polyol. The maleimidated amino acid is obtained by reacting maleic anhydride with aminoacetic acid or aminocaproic acid. The polyol may be a polyether polyol, a polyester polyol, a polycarbonate polyol, or a poly(meth)acrylate polyol, or may be free of aromatic rings.

The content of the thermosetting resin may be from 1 to 20 parts by mass or from 5 to 18 parts by mass, relative to 100 parts by mass of the silver particles. When the content of the thermosetting resin is not less than 1 part by mass, adhesiveness due to the thermosetting resin can be sufficiently obtained, and when the content of the thermosetting resin is not greater than 20 parts by mass, a decrease in the proportion of the silver component can be suppressed, a high level of thermal conductivity can be sufficiently ensured, and heat dissipation can be improved. Furthermore, at such a content of the thermosetting resin, the amount of organic components is not excessive, and deterioration due to light and heat can be suppressed, and as a result, the lifespan of a light-emitting device can be increased.

The paste composition of the present embodiment may further contain a diluent from the perspective of workability. Examples of the diluent include butyl carbitol, cellosolve acetate, ethyl cellosolve, butyl cellosolve, butyl cellosolve acetate, butyl carbitol acetate, diethylene glycol dimethyl ether, diacetone alcohol, N-methyl-2-pyrrolidone (NMP), dimethylformamide, N,N-dimethylacetamide (DMAc), γ-butyrolactone, 1,3-dimethyl-2-imidazolidinone, and 3,5-dimethyl-1-adamantanamine (DMA). These may be used alone or in a combination of two or more.

When the paste composition of the present embodiment contains a diluent, the content thereof may be from 3 to 20 parts by mass, from 4 to 15 parts by mass, or from 4 to 10 parts by mass, relative to 100 parts by mass of the silver particles. When the content of the diluent is 3 parts by mass or greater, the viscosity can be reduced through dilution, and when the content is less than or equal to 20 parts by mass, the generation of voids when curing the paste composition of the present embodiment can be controlled.

In addition to the components described above, the paste composition of the present embodiment can contain, as necessary, other additives that are generally compounded in this type of composition, examples of the other additives including curing accelerators; stress-lowering agents, such as rubber or silicone; coupling agents; antifoaming agents; surfactants; coloring agents such as pigments or dyes; polymerization initiators; various polymerization inhibitors; antioxidants; and solvents. Each of these additives may be used alone, or two or more may be mixed and used.

The paste composition of the present embodiment can be prepared by thoroughly mixing the above-described silver particles with the thermosetting resin, the diluent and the various additives, which are contained as necessary, and then kneading the mixture using a disperser, a kneader, a 3-roll mill, or the like, and subsequently defoaming the mixture.

The thermal conductivity of a cured product of the paste composition of the present embodiment may be 35 W/m·K or higher, or may be 40 W/m·K or higher.

The thermal conductivity can be measured by the method described in the examples.

The viscosity of the paste composition of the present embodiment may be from 70 to 200 Pa·s, or may be from 100 to 200 Pa·s.

The viscosity is a value measured at 25° C. using an E-type viscometer (3° cone). Specifically, the viscosity can be measured by the method described in the examples.

Semiconductor Device and Electrical and/or Electronic Components

The semiconductor device and the electrical and/or electronic components of the present embodiment are formed by bonding using the paste composition described above, and therefore have excellent reliability.

The semiconductor device of the present embodiment is formed by adhering a semiconductor element to a substrate serving as an element support member using the paste composition described above. In other words, here, the paste composition is used as a die attach material, and the semiconductor element and the substrate are adhered and fixed through this die attach material.

Here, the semiconductor element may be any known semiconductor element, and examples thereof include transistors and diodes. Further examples of the semiconductor element include a light-emitting element such as an LED. The type of light-emitting element is not particularly limited, and examples thereof include those in which a nitride semiconductor, such as InN, AN, GaN, InGaN, AlGaN, or InGaAlN is formed as a light-emitting layer on a substrate by a method such as the MOBVC method.

Moreover, examples of an element support member include a support member formed of a material such as copper, copper-plated copper, a pre-plated lead frame (PPF), glass epoxy, and ceramic.

By using the die attach material described above, the semiconductor element can also be bonded to a base material that has not been metal plated. The connection reliability of the semiconductor device obtained in this manner with respect to the temperature cycle after mounting is dramatically improved compared to that of conventional semiconductor devices. Furthermore, the electrical resistance value is sufficiently small with minimal change over time, and thus an advantage of achieving a long useful life with minimal reduction over time in output even when driven for a long period of time is achieved.

Moreover, the electrical and/or electronic components of the present embodiment is formed by adhering a heat-dissipating member to a heat-generating member using the paste composition described above. That is, the paste composition is used as a material for adhering a heat-dissipating member, and the heat-dissipating member and the heat-generating member are adhered and fixed through the paste composition.

The heat-generating member may be the semiconductor element described above or a member including the semiconductor element, or may be a heat-generating member other than the semiconductor element. Examples of the heat-generating member other than the semiconductor element include optical pickups and power transistors. In addition, examples of the heat-dissipating member include heat sinks and heat spreaders.

By adhering the heat-dissipating member to the heat-generating member using the material for adhering a heat-dissipating member in this manner, heat generated by the heat-generating member can be efficiently released to the outside through the heat-dissipating member, and thus a temperature increase of the heat-generating member can be suppressed. Note that the heat-generating member and the heat-dissipating member may be adhered directly through the heat-dissipating member adhesive material, or may be indirectly adhered with another member having a high thermal conductivity sandwiched in between.

EXAMPLES

Next, the present disclosure will be specifically described through examples; however, the present disclosure is not limited in any way to these examples.
Production of Silver Particles

Synthesis Example 1

A silver nitrate aqueous solution was prepared by dissolving 40 g of silver nitrate (available from Toyo Chemical Industrial, Inc.) in 10 L of ion-exchanged water, after which 203 mL of ammonia water having a concentration of 26 mass % was added to the silver nitrate aqueous solution, and the mixture was stirred, and thereby a silver ammine complex aqueous solution was obtained. Next, 50 g of a silver powder (product name: Ag-HWQ 1.5 µm, available from Fukuda Metal Foil & Powder Co., Ltd.; average particle size: 1.8 µm) was added to this aqueous solution, and a silver powder-dispersed silver ammine complex aqueous solution was formed. This aqueous solution was then brought to a liquid temperature of 10° C., and 28 mL of a 20 mass % hydrazine monohydrate aqueous solution (available from Hayashi Pure Chemical Ind., Ltd.) was added dropwise over a period of 60 seconds while stirring to precipitate silver onto the surface of the silver powder, and a silver particle-containing slurry was obtained. Next, oleic acid (available from Tokyo Chemical Industry Co., Ltd.) was added into this slurry at an amount of 1 mass % relative to the amount of silver, and the mixture was stirred for 10 minutes. The slurry was then filtered, and the filtered product was washed with water, washed with methanol, and then dried in a vacuum atmosphere at 60° C. for 24 hours to obtain silver particles 1.

Note that when the cross-sections of the obtained silver particles 1 were observed using a field emission scanning electron microscope (FE-SEM) (JSM-6700 F, available from JEOL Ltd.), it was confirmed that silver aggregated around the silver powder, and a silver layer was formed on the surface of the silver powder. Furthermore, the average particle size of the primary particles of silver forming the silver layer was 20 nm, the average particle size of the secondary particles in which the primary particles were aggregated was 1.9 µm, the tap density of the obtained silver particles 1 was 5.7 g/cm$^3$, and the specific surface area was 1.0 m$^2$/g.

Synthesis Example 2

A silver nitrate aqueous solution was prepared by dissolving 40 g of silver nitrate (available from Toyo Chemical Industrial, Inc.) in 10 L of ion-exchanged water, after which 203 mL of ammonia water having a concentration of 26 mass % was added to the silver nitrate aqueous solution, and the mixture was stirred, and thereby a silver ammine complex aqueous solution was obtained. Next, 50 g of silver powder (product name: AgS1.0, available from Tokuriki Honten Co., Ltd., average particle size: 1.59 µm) was inserted into this aqueous solution, and a silver powder-dispersed silver ammine complex aqueous solution was formed. This aqueous solution was then brought to a liquid temperature of 10° C., and 28 mL of a 20 mass % hydrazine monohydrate aqueous solution (available from Hayashi Pure Chemical Ind., Ltd.) was added dropwise over a period of 60 seconds while stirring to precipitate silver onto the surface of the silver powder, and a silver particle-containing slurry was obtained. Next, oleic acid (available from Tokyo Chemical Industry Co., Ltd.) was added into this slurry at an amount of 1 mass % relative to the amount of silver, and the mixture was stirred for 10 minutes. The slurry was filtered, and the filtered product was washed with water, washed with methanol, and then dried in a vacuum atmosphere at 60° C. for 24 hours to obtain silver particles 2.

Synthesis Example 3

A silver nitrate aqueous solution was prepared by dissolving 40 g of silver nitrate (available from Toyo Chemical Industrial, Inc.) in 10 L of ion-exchanged water, after which 203 mL of ammonia water having a concentration of 26 mass % was added to the silver nitrate aqueous solution, and the mixture was stirred, and thereby a silver ammine complex aqueous solution was obtained. Next, 50 g of silver powder (product name: AgS2.0, available from Tokuriki Honten Co., Ltd., average particle size: 2.45 µm) was inserted into this aqueous solution, and a silver powder-dispersed silver ammine complex aqueous solution was formed. This aqueous solution was then brought to a liquid temperature of 10° C., and 28 mL of a 20 mass % hydrazine monohydrate aqueous solution (available from Hayashi Pure Chemical Ind., Ltd.) was added dropwise over a period of 60 seconds while stirring to precipitate silver onto the surface of the silver powder, and a silver particle-containing slurry was obtained. Next, oleic acid (available from Tokyo Chemical Industry Co., Ltd.) was added into this slurry at an amount of 1 mass % relative to the amount of silver, and the mixture was stirred for 10 minutes. The slurry was filtered, and the filtered product was washed with water, washed with methanol, and then dried in a vacuum atmosphere at 60° C. for 24 hours to obtain silver particles 3.

Synthesis Example 4

A silver nitrate aqueous solution was prepared by dissolving 40 g of silver nitrate (available from Toyo Chemical Industrial, Inc.) in 10 L of ion-exchanged water, after which 203 mL of ammonia water having a concentration of 26 mass % was added to the silver nitrate aqueous solution, and the mixture was stirred, and thereby a silver ammine complex aqueous solution was obtained. Next, 50 g of silver powder (product name: AgS1.0, available from Tokuriki Honten Co., Ltd., average particle size: 1.59 μm) was inserted into this aqueous solution, and a silver powder-dispersed silver ammine complex aqueous solution was formed. This aqueous solution was brought to a liquid temperature of 10° C., and 20 mL of a 20 mass % hydrazine monohydrate aqueous solution (available from Hayashi Pure Chemical Ind., Ltd.) was added dropwise over a period of 60 seconds while stirring to precipitate silver onto the surface of the silver powder, and a silver particle-containing slurry was obtained. Next, oleic acid (available from Tokyo Chemical Industry Co., Ltd.) was added into this slurry at an amount of 1 mass % relative to the amount of silver, and the mixture was stirred for 10 minutes. The slurry was filtered, and the filtered product was washed with water, washed with methanol, and then dried in a vacuum atmosphere at 60° C. for 24 hours to obtain silver particles 4.

The silver particles obtained in Synthesis Examples 1 to 4 were evaluated by the following methods. The results are shown in Table 1.

Average Particle Size of Primary Particles

To measure the average particle size of the primary particles, 2.8 mL of a 20 mass % aqueous solution of hydrazine monohydrate was added dropwise over a period of 60 seconds to 1020 mL of the silver ammine complex aqueous solution obtained in each of the above synthesis examples, the mixture was subjected to a solid-liquid separation, and the obtained solid was washed with pure water and dried in a vacuum atmosphere at 60° C. for 24 hours, and silver particles thereby obtained were used.

The average particle size of the primary particles was determined by averaging the particle diameters of 200 silver particles measured using a field emission scanning electron microscope (FE-SEM) (JSM-6700 F available from JEOL, Ltd.) to observe the cross-sections of spherical silver particles cut by a focused ion beam (FIB) apparatus (JEM-9310FIB available from JEOL, Ltd.).

Average Particle Size of Secondary Particles

The average particle size of the secondary particles was determined from the particle size (50% particle size D50) at which the cumulative volume was 50% in a particle size distribution measured using a laser diffraction-type particle size distribution measurement device (product name: SALD-7500nano, available from Shimadzu Corporation).

Tap Density

The tap density (TD) was measured as the mass per unit volume (units: $g/cm^3$) of silver particles in a vibrated container using a tap density measuring instrument (Tap-Pak Volumeter, available from Thermo Scientific).

Specific Surface Area

The silver particles were degassed for 10 minutes at 60° C., and then the specific surface area was measured by the single point BET method through nitrogen adsorption using a specific surface area measuring device (Monosorb, available from Quantachrome Corporation).

TABLE 1

|  | Synthesis Example 1 Silver Particle 1 | Synthesis Example 2 Silver Particle 2 | Synthesis Example 3 Silver Particle 3 | Synthesis Example 4 Silver Particle 4 |
|---|---|---|---|---|
| Average particle size of primary particles [nm] | 20 | 20 | 20 | 30 |
| Average particle size of secondary particles [μm] | 1.9 | 2.2 | 2.7 | 2.0 |
| Tap density [$g/cm^3$] | 5.7 | 5.0 | 5.51 | 5.25 |
| Specific surface area [$m^2/g$] | 1.0 | 1.2 | 0.8 | 0.9 |

Examples 1 to 9, Comparative Examples 1 to 4

The various components were mixed according to the formulations in Table 2 and kneaded in a three-roll mill to obtain paste compositions. The obtained paste compositions were evaluated by the methods described below. The results are shown in Table 2. Note that a blank cell in Table 2 indicates that the given component was not blended.

The materials listed in Table 2 and used in the Examples and Comparative Examples are as follows.

Silver Particles X
- Silver particles 1: Silver particles obtained in Synthesis Example 1 (average particle size of primary particles: 20 nm, average particle size of secondary particles: 1.9 μm)
- Silver particles 2: Silver particles obtained in Synthesis Example 2 (average particle size of primary particles: 20 nm, average particle size of secondary particles: 2.2 PIT)
- Silver particles 3: Silver particles obtained in Synthesis Example 3 (average particle size of primary particles: 20 nm, average particle size of secondary particles: 2.7 PAT)
- Silver particles 4: Silver particles obtained in Synthesis Example 4 (average particle size of primary particles: 30 nm, average particle size of secondary particles: 2.0 μm)

Silver particles, "silver particles Y", obtained by a production method other than the method for producing silver particles of the present embodiment
- TC-505C (available from Tokuriki Honten Co., Ltd., product name, average particle size: 1.93 tap density: 6.25 $g/cm^3$, specific surface area: 0.65 $m^2/g$)
- Ag-HWQ 1.5 μm (available from Fukuda Metal Foil & Powder Co., Ltd., product name, average particle size: 1.8 μm; tap density: 3.23 $g/cm^3$; specific surface area: 0.5 $m^2/g$)
- AgC-221PA (available from Fukuda Metal Foil & Powder Co., Ltd., product name, average particle size: 7.5 μm; tap density: 5.7 $g/cm^3$; specific surface area: 0.3 $m^2/g$)
- DOWA Ag nano powder-1 (available from DOWA Electronics Materials Co., Ltd., product name, average particle size: 20 nm)
- DOWA Ag nano powder-2 (available from DOWA Electronics Materials Co., Ltd., product name, average particle size: 60 nm)

Thermosetting Resin
- Epoxy resin: (available from Mitsubishi Chemical Corporation, product name: YL983U)
- Acrylic resin (available from KJ Chemicals Corporation, product name: HEAA (trade name))
- Bisphenol F (available from Honshu Chemical Industry Co., Ltd., product name: Bisphenol F)

Diluent
  Butyl carbitol (available from Tokyo Chemical Industry Co., Ltd.)
Other Components
  Imidazole (available from Shikoku Chemicals Corporation, product name: Curezol 2P4MHZ-PW)
  Dicumyl peroxide (available from NOF Corporation, product name: Percumyl (trade name) D)

Evaluation Method

Thermal Conductivity
  Measuring instrument: LFA-502 (available from Kyoto Electronics Manufacturing Co., Ltd.)
Measurement Method: Laser Flash Method
  The thermal conductivity of a cured product of the paste composition was measured in accordance with JIS R 1611-1997 by the laser flash method using the measuring instrument indicated above.

Volume Resistivity
  A glass substrate having a thickness of 1 mm was coated with the paste composition so as to have a thickness of 30 μm using a screen printing method, and then cured at 190° C. for 60 minutes. The volume resistivity of the obtained wiring was measured by a 4-terminal method using the resistivity meter MCP-T600 (product name, available from Mitsubishi Chemical Corporation).

Viscosity
  The viscosity value at a temperature of 25° C. and a rotational speed of 0.5 rpm was measured using an E-type viscometer (available from Toki Sangyo Co., Ltd., product name: VISCOMETER-TV22, applied cone plate-type rotor: 3°×R17.65).

Pot Life
  The paste composition was left standing in a constant-temperature bath at 25° C., and the number of days until the viscosity of the paste composition increased to 1.5 times or more the initial viscosity was measured.

Warpage
  The paste composition was used to mount, onto a copper substrate that had been Ag plated on the surface, a back surface gold silicon chip having a gold vapor-deposited layer provided on an 8 mm×8 mm bonding surface, and then the paste composition was cured at 190° C. for 60 minutes to produce a semiconductor package, and the package warpage of the semiconductor package was measured at room temperature (25° C.). The package warpage of the semiconductor package was measured in accordance with the JEITA ED-7306 standard of the Japan Electronics and Information Technology Industries Association using a shadow moiré measuring device (TherMoiré AXP, available from Akrometrix, LLC) as the measuring device. Specifically, a virtual plane calculated by the least squares method from all data of a substrate surface of a measurement region was used as a reference plane, a maximum value in a direction perpendicular from the reference plane was considered to be A, and a minimum value was considered to be B, and a value (coplanarity) of |A|+|B| was used as the package warpage value.

Cooling and Heating Cycle Test
  The paste composition was used to mount, onto a copper substrate that had been Ag plated on the surface, a back surface gold silicon chip having a gold vapor-deposited layer provided on an 8 mm×8 mm bonding surface, and then the paste composition was cured at 190° C. for 60 minutes to produce a semiconductor package. The semiconductor package was subjected to a cooling and heating cycle process (an operation of raising the temperature from −55° C. to 150° C. and then cooling to −55° C. was considered to be one cycle, and this cycle was repeated 2000 times), and after this process, the presence or absence of peeling of the chip was observed using an ultrasonic microscope (FineSAT II, available from Hitachi Power Solutions Co., Ltd.) and evaluated according to the following criteria.
(Determination Criteria)
  A: No peeling
  C: Peeling present

TABLE 2

| | | | | Examples | | | | | | | | | Comparative Examples | | | |
|---|---|---|---|---|---|---|---|---|---|---|---|---|---|---|---|---|
| | | | Units | 1 | 2 | 3 | 4 | 5 | 6 | 7 | 8 | 9 | 1 | 2 | 3 | 4 |
| Paste Composition | Silver Particle X | Silver Particle 1 | parts by mass | 100 | | | | | 100 | 95 | 80 | 70 | 60 | | | | |
| | | Silver Particle 2 | parts by mass | | 100 | | | | | | | | | | | |
| | | Silver Particle 3 | parts by mass | | | 100 | | | | | | | | | | |
| | | Silver Particle 4 | parts by mass | | | | 100 | | | | | | | | | |
| | Silver Particle Y | TC-505C | parts by mass | | | | | | | 5 | 20 | 30 | 40 | | | | |
| | | Ag-HWQ 1.5 μm | parts by mass | | | | | | | | | | | 100 | | | |
| | | AgC-221PA | parts by mass | | | | | | | | | | | | 100 | | |
| | | DOWA Ag nano powder-1 | parts by mass | | | | | | | | | | | | | 100 | |
| | | DOWA Ag nano powder-2 | parts by mass | | | | | | | | | | | | | | 100 |
| | Thermosetting resin | Epoxy resin (YL983U) | parts by mass | 10 | 10 | 10 | 10 | | 10 | 10 | 10 | 10 | 10 | 10 | 10 | 10 |
| | | Acrylic resin (HEAA (trade name)) | parts by mass | | | | | 10 | | | | | | | | |
| | | Bisphenol F | parts by mass | 2 | 2 | 2 | 2 | | 2 | 2 | 2 | 2 | 2 | 2 | 2 | 2 |
| | Diluent | Butyl carbitol | parts by mass | 5 | 5 | 5 | 5 | 3 | 5 | 5 | 5 | 5 | 5 | 5 | 5 | 5 |

TABLE 2-continued

|  |  |  | Units | Examples | | | | | | | | | Comparative Examples | | | |
|---|---|---|---|---|---|---|---|---|---|---|---|---|---|---|---|---|
|  |  |  |  | 1 | 2 | 3 | 4 | 5 | 6 | 7 | 8 | 9 | 1 | 2 | 3 | 4 |
|  | Other components | 2P4MHZ-PW | parts by mass | 0.1 | 0.1 | 0.1 | 0.1 |  | 0.1 | 0.1 | 0.1 | 0.1 | 0.1 | 0.1 | 0.1 | 0.1 |
|  |  | Percumyl (trade name) D | parts by mass |  |  |  |  | 0.5 |  |  |  |  |  |  |  |  |
| Evaluation Results | | Thermal conductivity λ | W/mK | 50 | 60 | 54 | 55 | 75 | 62 | 55 | 50 | 42 | 8 | 4 | 30 | 36 |
|  |  | Volume resistivity ρV | μΩ·cm | 10 | 0.9 | 11 | 10 | 9.2 | 24 | 26 | 26 | 27 | 445 | 120 | 320 | 280 |
|  |  | Viscosity | Pa·s | 102 | 121 | 110 | 100 | 150 | 180 | 162 | 150 | 135 | 300 | 74 | 420 | 380 |
|  |  | Pot life | days | 7> | 7> | 7> | 7> | 7> | 7> | 7> | 7> | 7> | 7> | 7> | 1 | 1 |
|  |  | Warpage | μm | 69 | 67 | 65 | 64 | 82 | 74 | 70 | 71 | 68 | 60 | 65 | 95 | 94 |
|  |  | Cooling and heating cycle test | — | A | A | A | A | A | A | A | A | A | C | C | C | C |

Examples 1 to 9 in which paste compositions containing the silver particles of the present disclosure were used each exhibited low viscosity and excellent dispersibility. Furthermore, the cured products of these paste compositions exhibited high thermal conductivity and low warpage. Moreover, the semiconductor packages obtained using these paste compositions all exhibited excellent adhesiveness without the observation of peeling of the chip after the cooling and heating cycle test.

The invention claimed is:

1. A paste composition comprising:
   a plurality of silver particles that each include:
   a silver powder, wherein the silver powder has an average particle diameter (D50) of 1.59 to 2.45 μm, wherein the plurality of silver particles have a tap density from 4.0 to 7.0 g/cm³ and a specific surface area from 0.5 to 1.5 m²/g as determined by the BET method;
   an organic protecting compound, wherein a compounded amount of the organic protecting compound is from 1 to 5 mmol per mole of silver particles in the paste composition; and
   a silver layer, wherein the silver layer includes primary particles that are smaller than the silver powder and the primary particles have a mean particle size of 20-50 nm;
   a thermosetting resin, wherein the thermosetting resin is between 5 to 18 parts by mass relative to 100 parts by mass of the plurality of the silver particles; and
   a diluent, wherein the diluent is between 4 and 10 parts by mass relative to 100 parts by mass of the plurality of the silver particles, and wherein the diluent consists essentially of 3,5-dimethyl-1-adamantanamine;
   wherein the paste composition has a volume resistivity of 0.9-27 μΩ*cm.

2. The paste composition according to claim 1, wherein the silver layer is formed by a liquid phase reduction method.

3. The paste composition according to claim 1, wherein the silver layer is formed by mixing a silver powder (A), a silver compound (B), and a reducing compound (C) in a liquid phase.

4. The paste composition according to claim 3, wherein the silver powder (A) is formed by an atomization method, an electrolysis method, or a chemical reduction method.

5. The paste composition according to claim 3, wherein the silver compound (B) is at least one selected from a group consisting of silver nitrate, silver chloride, silver acetate, silver oxalate, and silver oxide.

6. The paste composition according to claim 1, wherein the organic protecting compound is at least one selected from a group consisting of a carboxylic acid, an alkylamine, and a carboxylic acid amine salt.

7. A semiconductor device formed by bonding using the paste composition described in claim 1.

8. Electrical and/or electronic components formed by bonding using the paste composition described in claim 1.

9. The paste composition of claim 1, wherein the diluent consists of 3,5-dimethyl-1-adamantanamine.

* * * * *